United States Patent [19]

Blake

[11] Patent Number: 5,079,605

[45] Date of Patent: Jan. 7, 1992

[54] SILICON-ON-INSULATOR TRANSISTOR WITH SELECTABLE BODY NODE TO SOURCE NODE CONNECTION

[75] Inventor: Terence G. W. Blake, Dallas, Tex.

[73] Assignee: Texas Instruments Incorporated, Dallas, Tex.

[21] Appl. No.: 441,591

[22] Filed: Nov. 27, 1989

Related U.S. Application Data

[62] Division of Ser. No. 226,106, Jul. 29, 1988, Pat. No. 4,907,978.

[51] Int. Cl.$^5$ ............... H01L 27/12; H01L 23/48; H01L 27/01; H01L 29/06
[52] U.S. Cl. ................... 357/23.7; 357/4; 357/86; 357/67; 357/23.9
[58] Field of Search ............... 357/23.7, 4, 86, 67 S, 357/23.9

[56] References Cited

U.S. PATENT DOCUMENTS

| | | | |
|---|---|---|---|
| 4,053,916 | 10/1977 | Cricchi et al. | 357/23 |
| 4,753,896 | 6/1988 | Matloubian | 437/29 |
| 4,899,202 | 2/1990 | Blake et al. | 357/23.7 |

OTHER PUBLICATIONS

Kumator et al., "An SOI Structure for Flash A/D Converter", IEEE J. Soc vol.-23, No. 1, Feb. 1988, pp. 198-201.

Tihany et al., "Properties of ESFI MOS Transistors Due to the Floating Substrate and the Finite Volume", IEEE Trans. E.D., vol. ED-22, No. 11, Nov. 1975, pp. 1017-1023.

Tihany et al., "Influence of the Floating Substrate Potential on the Characteristics of ESFI MOS Transistors", Solid State Electronics, vol. 18 (Pergamon, 1975), pp. 309-314.

Lee et al., "Island-Edge Effects in CMOS/SOS Transistors", IEEE Trans. E.D., vol. ED-25, No. 8 (Aug. 1978), pp. 971-978.

Primary Examiner—Rolf Hille
Assistant Examiner—Wael Fahmy
Attorney, Agent, or Firm—Douglas A. Sorensen; James T. Comfort; Melvin Sharp

[57] ABSTRACT

A silicon-on-insulator MOS transistor (100) is disclosed which has contact regions on both the source (6) and drain (8) sides of the gate electrode (10) for (36,38) potentially making contact to the body node (12) from either side. Each contact region (36,38) is of the same conductivity type as the body node (12), (for example, a p-type region for an n-channel transistor), and may be formed by blocking all source/drain implants from the contact regions (36,38), so that the contact region (36,38) remains substantially with the same doping concentration as the of the body region (12). A mask is provided prior to silicidation so that the contact regions (36,38) on either side of the gate electrode (12) are not connected by silicide to the adjacent source/drain doped regions (6,8). Once a side is selected to be the source of the transistor, ohmic connection is then made between the abutting source region (6) and the contact region (36) by way of contacts (22,23) through an overlying interlevel dielectric (40) and metallization (25). A second embodiment of the transistor (200) is disclosed which provides such contact with reduction in the channel width, by allowing the lightly-doped drain extension of the source (19) and drain (18) to be present between the contact region (36,37,38) on both sides of its gate so that all of the contact regions on the mesa are connected through the body nodes of the transistors. A single body-to-source node connection can thus provide body node bais for all of the transistors on the mesa.

28 Claims, 8 Drawing Sheets

SILICON-ON-INSULATOR TRANSISTOR WITH SELECTABLE BODY NODE TO SOURCE NODE CONNECTION

This is a division, of application Ser. No. 07/226,106, filed July 29, 1988 now U.S. Pat. No. 4,907,978.

This invention is in the field of integrated circuits, and is specifically directed to insulated-gate field effect transistors formed by silicon-on-insulator (SOI) technology.

This application is related to application U.S. Pat. No. 4,974,051, issued Nov. 27, 1990, and to applications Ser. No. 216,933 (TI-13559) and Ser. No. 216,932 (TI-13560), both filed July 8, 1988 and both assigned to Texas Instruments Incorporated.

BACKGROUND OF THE INVENTION

Silicon-on-insulator (SOI) technology is becoming of increasing importance in the field of integrated circuits. SOI technology deals with the formation of transistors in a layer of semiconductor material which overlies an insulating layer; the most common embodiment of SOI structures is a single crystal layer of silicon which overlies a layer of silicon dioxide. High performance and high density integrated circuits are achievable using SOI technology because of the reduction of parasitic elements present in integrated circuits formed in bulk semiconductor. For example, for an MOS transistor formed in bulk, parasitic capacitance is present at the junction between the source/drain regions and the underlying substrate, and the possibility of breakdown of the junction between source/drain regions and the substrate region also exists. A further example of parasitic elements are present for CMOS technology in bulk, where parasitic bipolar transistors formed by n-channel and p-channel transistors in adjacent wells can give rise to latch-up problems. Since SOI structures significantly alleviate the parasitic elements, and increase the junction breakdown tolerance of the structure, the SOI technology is well-suited for high performance and high density integrated circuits.

It should be noted that a similar technology to SOI is the silicon-on-sapphire (SOS) technology, which provides similar benefits as those discussed relative to SOI technology above. It should be noted that the invention to be disclosed herein is applicable to SOS structures, as well.

The underlying insulator film in an SOI structure presents certain problems relative to the transistor characteristics, however. In bulk transistors, electrical connection is easily made via the substrate to the body node of an MOS transistor. The relatively fixed bias of the body node provides for a stable threshold voltage relative to the drain-to-source voltage. However, conventional SOI transistors have the body node (i.e., the undepleted volume within the body region) electrically floating, as the body node is isolated from the substrate by the underlying insulator film. Under sufficient drain-to-source bias (even, in some cases, with zero gate bias), impact ionization can generate electron-hole pairs near the drain which, due to the majority carriers traveling to the body node while the minority carriers travel to the drain, cause a voltage differential between the body node and the source of the transistor. This voltage differential lowers the effective threshold voltage and increases the drain current, resulting in the well known "kink" in the drain current-voltage characteristic.

Furthermore, the SOI transistor includes a parasitic "back channel" transistor, with the substrate as the gate and the insulator film underlying the transistor as the gate dielectric. This back channel may provide a drain-source leakage path along the body near the interface with the buried insulator. In addition, the dielectrically isolated body node allows capacitive coupling between the body node and the gate, and diode coupling between the body node and the source and drain, to bias the body node and thus affect the threshold voltage. Each of these factors can contribute to undesirable performance shifts in the transistor relative to design, as well as to increased instability of the transistor operating characteristics.

It is therefore useful to provide electrical bias to the body node of a transistor. A useful body node bias, as in the bulk case, is to ohmically connect the body node to the source of the MOS transistor. This requires that the source node of the transistor be specified, and connection made thereto from the body node of the transistor. Prior methods for body-to-source node connection require specification of the mesa regions on the sides of the gate as drain and source relatively early in the fabrication process. An example of such a method is described in U.S. Pat. No. 4,974,051, issued Nov. 27, 1990, and assigned to Texas Instruments Incorporated, where the source is defined by dedicating a portion of the mesa adjacent to the gate to receive an implant of the same conductivity type as the body, and connecting this dedicated portion to the source via a refractory metal silicide.

In the manufacture of mask-programmable logic such as gate arrays, it is preferable that the routing be determined as late as possible in the fabrication process, providing maximum flexibility in the assignment of transistors to specific gates. In conventional gate arrays, the specification of which node of a transistor is to be the drain and which is to be the source would preferably be done at the mask levels of metal contacts and metal, as such mask levels are generally the levels at which the interconnection routing and gate utilization is performed.

It is therefore an object of this invention to provide an insulated-gate field effect transistor formed in a semiconductor region overlying an insulator, where specification of the drain and source nodes of the transistor may be done at a relatively late point in the fabrication process.

It is another object of this invention to provide such a transistor where such specification may be done at the metal contact mask level.

It is another object of this invention to provide such a transistor which can be fabricated in conjunction with silicide-cladding of the source and drain diffusions.

It is a further object of this invention to provide such a transistor which provides such contact without reducing the effective channel width of the transistor.

Other objects and advantages of the invention will become apparent to those of ordinary skill in the art having reference to this specification and the accompanying drawings.

SUMMARY OF THE INVENTION

The invention may be incorporated into a silicon-on-insulator insulated-gate field effect transistor which has doped contact regions of the same conductivity type as the body node disposed within both the source and drain portions of the moat region. Since the contact regions and body node (underlying the gate electrode) are of the same conductivity type, the contact regions are ohmically connected to the body node. A mask is used to prevent silicidation from connecting the contact regions on both sides to the source and drain diffusions at the surface, while allowing silicidation to clad a large portion of the source and drain regions, reducing series resistance. At the contact mask level, a contact may be etched to the contact region on the selected side, and to the source region on the same side. The metallization level can then connect the source diffusion to the contact region, providing the proper bias to the body node.

DETAILED DESCRIPTION OF THE PREFERRED EMBODIMENTS

Figure 1:
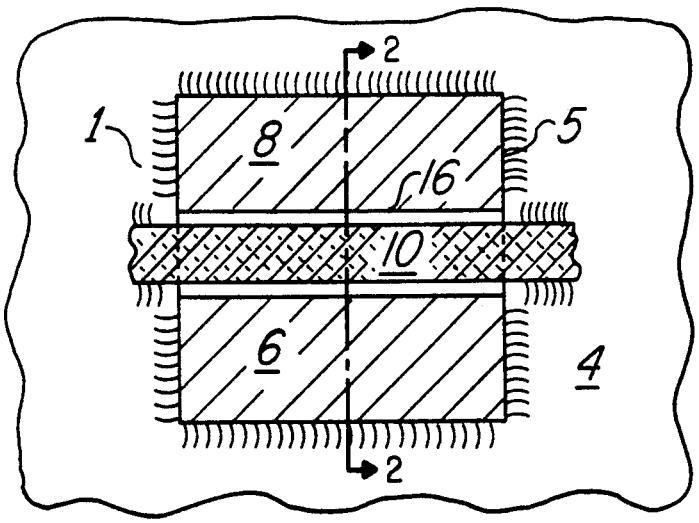
FIGS. 1 and 2 are plan and cross-sectional views, respectively, of a conventional SOI MOS transistor.
Figure 2:
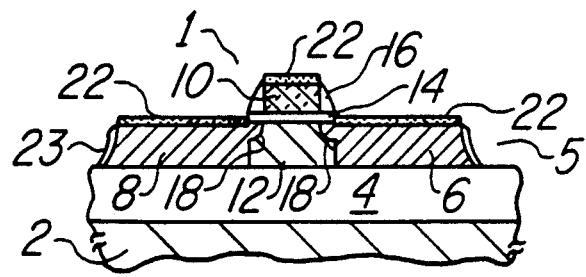

Referring to FIGS. 1 and 2, an n-channel SOI transistor according to the prior art is illustrated in plan view and cross-sectional view, respectively. As shown in FIG. 2, the transistor is formed in a single-crystal silicon mesa 5 overlying an insulator film 4 which is formed on a silicon substrate 2. Insulator film 4 is generally silicon dioxide. The formation of mesa 5 over insulator 4 can be done by any one of a number of known methods such as SIMOX (Separation by IMplanted Oxygen), oxidized porous silicon (FIPOS), and thin film zone-melting recrystallization (ZMR). An example of the SIMOX process is described in U.S. Pat. No. 4,863,878 issued Sept. 5, 1989, assigned to Texas Instruments Incorporated.

Gate insulator 14, such as thermally grown silicon dioxide, deposited silicon nitride, or a combination thereof, is disposed on the surface of single-crystal mesa 5. Gate electrode 10, commonly formed of heavily doped polycrystalline silicon, overlies gate insulator 14, and defines the gate of the MOS transistor of FIGS. 1 and 2. Source region 6 and drain region 8 are heavily-doped n-type regions which are formed by ion implantation and subsequent diffusion. As shown in FIG. 2, this example of a conventional transistor is formed according to the well-known lightly-doped drain construction, with implantation of the lightly-doped regions 18 performed in a self-aligned manner to gate electrode 10 (generally prior to formation of sidewall oxide filaments 16). An example of a method for forming lightly-doped drain transistors by use of sidewall oxide filaments is described in U.S. Pat. No. 4,356,623 issued Nov. 2, 1982 and assigned to Texas Instruments Incorporated. The heavily doped portions of source and drain regions 6 and 8 of FIGS. 1 and 2 are shown as formed in self-aligned fashion relative to the gate electrode 10 and sidewall oxide filaments 16, and fully extend from the surface of mesa 5 to the interface with insulator 4. Body node region 12 is a p-channel region which is not doped with n-type dopant used to form source and drain regions 6 and 8, but remains at the same conductivity type and concentration (p-type silicon which is lightly doped relative to the dopant concentration of source and drain regions 6 and 8) as originally formed. Sidewall insulator filaments 23 passivate the edges of mesa 5.

It should be noted that a refractory metal silicide film 22, such as titanium disilicide, is shown in FIG. 2 as cladding source and drain regions 6 and 8, as well as gate electrode 10. Such silicidation is useful in reducing the sheet resistance of the semiconducting layers, and is preferably done according to the well-known self-aligned direct react silicidation process, such as is described in U.S. Pat. No. 4,690,730 issued Sept. 1, 1987 and assigned to Texas Instruments Incorporated. Such silicidation is of course not essential to the operation of the transistor. Any one of the well known refractory metals conventionally used in silicidation, such as molybdenum, tungsten, and cobalt, may alternatively be used for formation of silicide film 22.

For transistor 1 of FIGS. 1 and 2, body node 12 is electrically isolated in the transistor of FIGS. 1 and 2. Since source and drain regions 6 and 8 extend through the full thickness of mesa 5 to reach insulator 4, and since the self-alignment of source and drain regions 6 allows body node 12 to exist only under gate electrode 10 (and lightly-doped drain regions 18, if present), it is inconvenient to form a contact to body node 12 in the structure of FIGS. 1 and 2. Accordingly, conventional SOI technology has the body node 12 of each MOS transistor in a floating state.

The floating body node of the SOI transistor 1 presents certain problems in the performance, and performance stability, of the transistor. A first problem is the presence of a parasitic "back channel" transistor, having substrate 2 as a gate electrode and insulator film 4 as the gate dielectric. This back channel may provide for a drain-source leakage path along the body node 12 near the interface with insulator film 4, depending upon the local potential of substrate 2 at the transistor location. In addition, it is well known that the voltage of body node 12 will affect the threshold voltage ($V_t$) of the transistor. While in bulk devices the MOS transistor body nodes are biased by the substrate, the dielectrically isolated body node 12 of transistor 1 of FIGS. 1 and 2 allows capacitive coupling between body node 12 and gate electrode 10, and diode coupling between body node 12 and source and drain regions 6 and 8, to bias body node 12 to an undesired potential. Furthermore, impact ionization occurs when carriers near the drain are at a sufficiently high potential that electron-hole pairs are created which, due to the majority carriers traveling to the body node while the minority carriers travel to the drain, cause a voltage differential between body node 12 and source region 6, lowering the effective threshold voltage and increasing the drain current (i.e., the well known "kink" effect).

Figure 3:
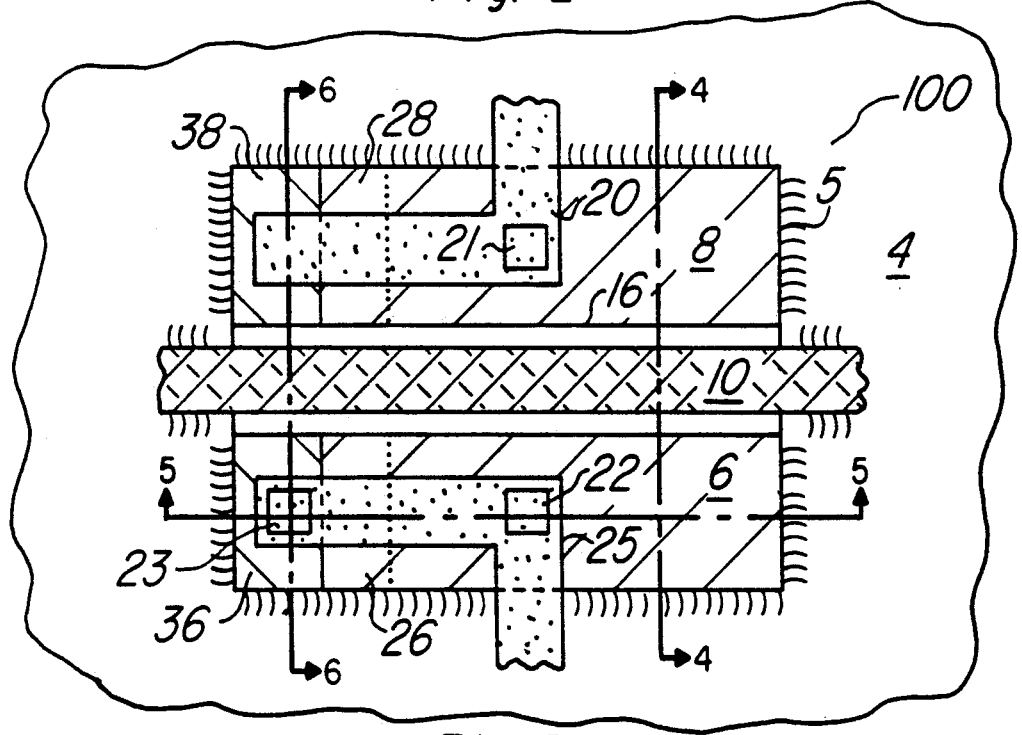
FIG. 3 is a plan view of an SOI MOS transistor constructed according to the invention.
Figure 4:
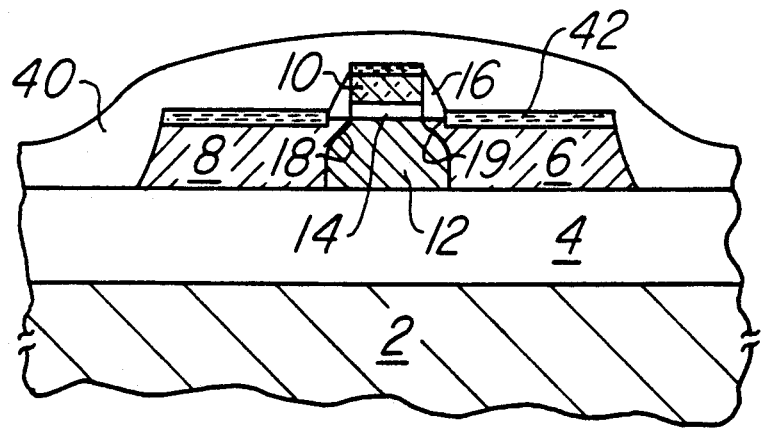
FIGS. 4 through 6 are various cross-sectional views of the transistor of FIG. 3.
Figure 5:
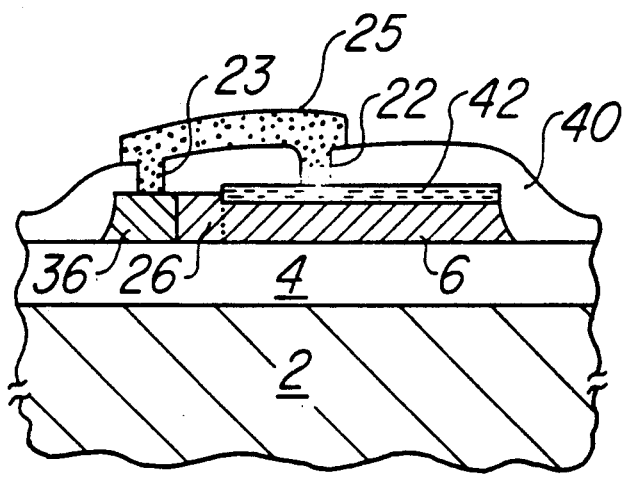

Referring now to FIGS. 3 through 5, a transistor 100 constructed according to the invention is illustrated; like reference numerals will be used to refer to like elements as used in the conventional transistor 1 of FIGS. 1 and 2. Transistor 100, as will explained hereinbelow, includes a contact between the source and body nodes to alleviate the problems of the floating body node described above relative to conventional transistor 1. The plan view of FIG. 3 shows contact regions 36 and 38 along one edge of mesa 5 on the source and drain sides, respectively, of gate electrode 10. It should be noted that contact regions 36 and 38 may be placed along opposite edges of mesa 5, if desired.

Source region 6 and drain region 8, as well as gate electrode 10, are clad with a refractory metal silicide film (the silicide film is not shown in FIG. 3 for purposes of simplicity). N+ portion 26 of of the source of transistor 100 is disposed between contact region 36 and source region 6 and is not silicide-clad; similarly, non-silicided n+ drain region 28 is disposed between contact region 38 and drain region 8. As will be explained below, silicide cladding is preferably used to reduce the series resistance of source region 6 and drain region 8, with the silicidation masked from the surfaces of contact regions 36 and 38 and of non-silicided source and drain regions 26 and 28, so that the specification of source and drain of transistor 100 may be made at the contact step. The boundaries between non-silicide source region 26 and source region 6 and between non-silicided drain region 28 and drain region 8 are illustrated in FIG. 3 by the dotted lines.

A patterned metal layer is disposed over an insulating layer 40 (not shown in FIG. 3), with a line 20 making contact to drain region 8 via contact 21, and a line 25 making contact to source region 6 via contact 22 and to contact region 38 via contact 23. Line 25 thus makes connection between contact region 26 and source region 6 which, due to contact region 26 being the same conductivity type as the body node underlying gate electrode 10, makes ohmic connection between the source and body nodes of transistor 100. Line 20 is shown in FIG. 3 as extending over contact region 38, but no contact is present so that line 20 does not connect contact region 38 to drain region 8; such extension of line 20 allows the specification of the source and drain sides of transistor 100 to be made solely by the contact mask layer; of course, if the mask layer used for patterning metal lines 20 and 25 is customizable along with the mask level for contact 23, such extension of line 20 is unnecessary.

It should be noted that FIG. 3 illustrates that contact 23 is fully placed within contact region 36; sufficient ohmic contact to contact region 36 is of course possible with contact 23 overlapping the boundary between contact region 36 and non-silicided n+ region 26. Provision of the contact 23 fully within contact region 36 also provides the ability to bias the body node of transistor 100 to a voltage different from the voltage of source region 6 (for example, a lower voltage than the voltage of source region 6) by provision of a separate metal line running to contact 23.

It should be noted that the direct contact of metal line 25 to lightly-doped p-type contact region 36 is sufficiently ohmic for purposes of biasing the body node of transistor 100, as only a low level of current flow is required to bias body node 12 in this configuration. The performance of this contact may of course be improved by heavily doping contact region 36, at the expense of additional process complexity; alternative methods for providing heavy doping to the contact region 36 will be described hereinbelow.

It should be noted that placement of contact regions 36 the edge of the mesa 5 is not essential to provide for contact between the body node 12 and source region 6. However, as described in U.S. Pat. No. 4,974,051, issued Nov. 27, 1990, and assigned to Texas Instruments Incorporated, the presence of contact regions 36 at the edge of the mesa reduces source-drain leakage of the transistor 100 in the event of exposure to ionizing radiation.

Furthermore, it should be noted that the active semiconductor formed over the insulator layer 4 can, for many SOI technologies, contain a relatively large number of dislocation defects compared to the active region in bulk. These dislocations, especially along the edges of silicon mesas such as mesa 5, can allow diffused dopants forming source and drain regions 6 and 8 to diffuse through the body region 12, especially along the edges of mesa 5. This enhanced diffusion can cause short channel effects such as sub-threshold leakage in transistor 100 and, if the diffused dopant extends fully between source region 6 and drain region 8, can short drain region 8 to source region 6. The placement of the contact regions 36 and contact regions 38 at the edge of mesa 5 reduces the source/drain leakage resulting from such enhanced diffusion by separating the dopant of source region 6 and drain region 8 from the edge of mesa 5 at gate electrode 10, reducing enhanced diffusion into the body region 12. In addition, placement of contact regions 36 at the edge of the mesa places a p-type region between any such diffusing dopant and source region 6, providing diode isolation between the n-type enhanced diffusion and source region 6. Accordingly, the placement of contact regions 36 and 38 at an edge of mesa 5 reduces source/drain leakage due to such enhanced interfacial diffusion of the source/drain dopant. It may therefore be preferable from the standpoint of reducing source/drain leakage from such enhanced diffusion to place contact regions 36 and 38 on both ends of transistor 100 to minimize edge leakage. The necessity for such additional contacts depends upon the amount of leakage present and tolerable, as well as upon the increased transistor size required to compensate the reduced channel width resulting from such additional contact regions 36 and 38.

FIG. 4 illustrates, in cross-section, transistor 100 of FIG. 3 taken at a location to show the active portion thereof, away from contact regions 36 and 38. A gate dielectric 14 is disposed under gate electrode 10, and may be formed of silicon dioxide, silicon nitride, or a combination thereof, as conventional for MOS gate dielectrics. A lightly-doped drain extension 18, and a lightly-doped drain extension 19, underlie sidewall filaments 16 on the drain and source sides, respectively, of gate electrode 10. In this embodiment, source and drain regions 6 and 8 extend through the full thickness of mesa 5, reaching insulator 4, although such depth is not essential to achieve the benefits of the instant invention. Silicide film 42 clads source region 6, drain region 8, and gate electrode 10; as described above, the provision of sidewall filaments 16 facilitate self-aligned silicidation of these structures. Interlevel dielectric 40 is shown in FIG. 4 disposed over the structure; the composition of interlevel dielectric 40 may be deposited silicon dioxide, or such other material as conventionally used to provide insulation between metallization layers and structures lying thereunder.

FIG. 5 is a cross-sectional view taken orthogonally to the view of FIG. 4, at a location in source region 6. As shown in FIG. 5, silicide film 42 does not extend over the entire width of source region 6, but stops short of contact region 36, leaving an n+ region 26 which does not have a silicided surface. Contact region 36 is p-type material which, in this embodiment, is an undoped portion of mesa 5 which remains after the doping required to form source region 6 (and region 26). Metal line 25 is shown in FIG. 5 as disposed over interlevel dielectric 40, and making contact to source region 6 (silicide film 42 thereupon) and to contact region 36 through contacts 22 and 23, respectively.

Figure 6:
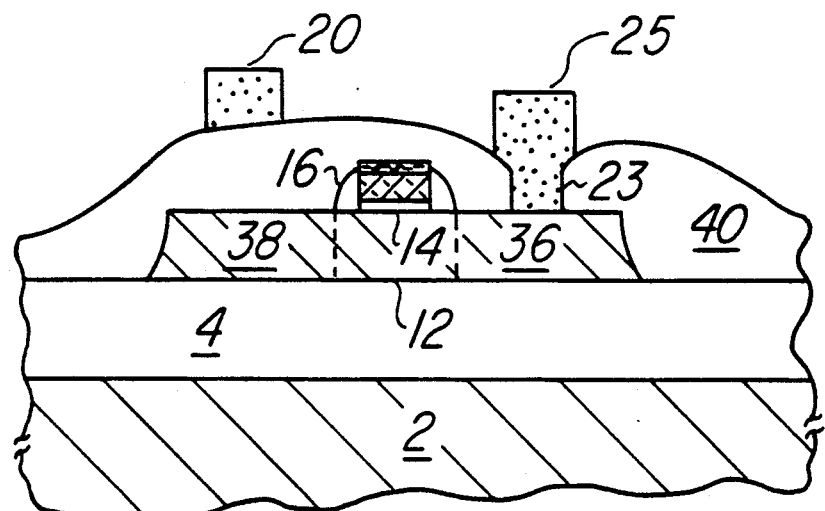

FIG. 6 is another cross-sectional view, taken in a direction orthogonal to that of FIG. 5, at a location through contact regions 36 and 38. As described above, contact regions 36 and 38 are portions of mesa 5 which remain undoped through the formation of source regions 6 and 26. Accordingly, contact regions 36 and 38 will extend from the surface of mesa 5 to insulator layer 4, and will indeed remain unitary with body region 12, as shown in FIG. 6. However, it should be noted that it is not essential for contact regions 36 and 38 to so fully extend to insulator 4 in order to make contact to body region 12, so long as contact regions 36 and 38 extend below the surface to a depth below the depletion layer under the conduction channel, so as to contact body region 12 in the "on" condition of transistor 100. Contact regions 36 and 38 are not clad with silicide film 42. Metal lines 20 and 25 are shown in FIG. 6 as overlying interlevel dielectric 40. In this example, where contact region 36 is on the source side of the transistor and where contact region 38 is on the drain side, a contact 23 is formed through interlevel dielectric 40 so that metal line 25 makes contact to contact region 36. No such contact is formed through interlevel dielectric 40 under metal line 20, so no contact is made to contact region 38.

An example of the doping concentration of the regions of transistor 100 according to the invention, with a channel length of 1 micron, provides an impurity concentration of $10^{17}/cm^3$ for body region 12 and contact regions 36 and 38. Source and drain regions 6 and 8, and regions 26 and 28, generally can have an impurity concentration of $10^{19}$ to $10^{21}/cm^3$, with lightly-doped drain extensions 18 and 19 in the range of $10^{18}$ to $10^{20}/cm^3$, depending upon the dopant gradient desired.

Figure 7A:
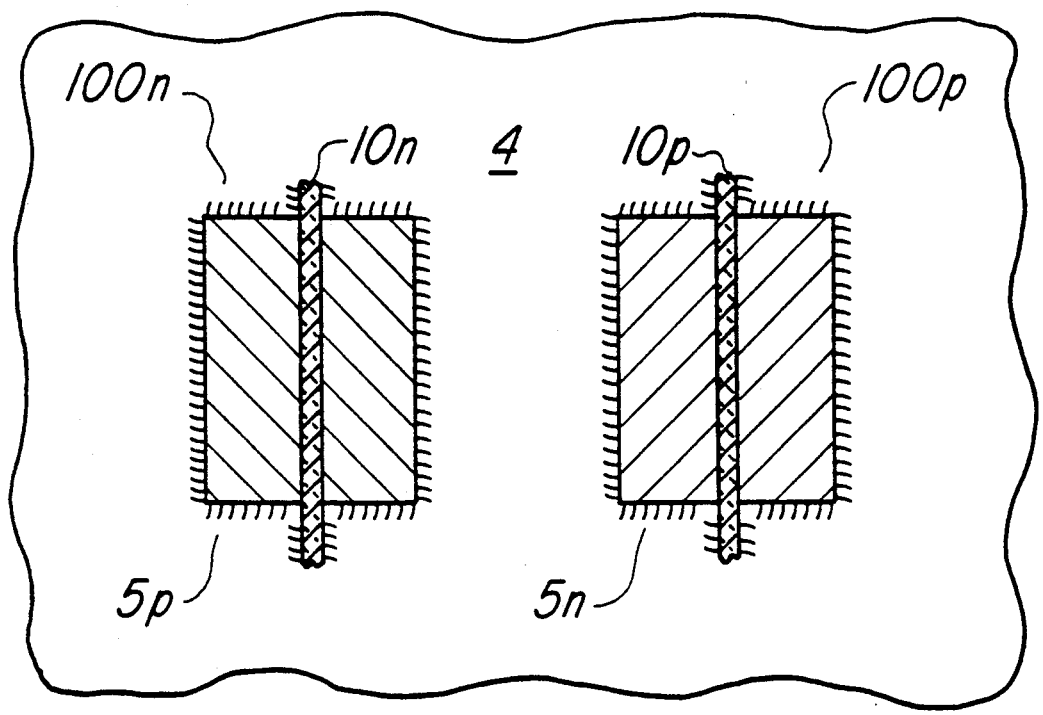
FIGS. 7a through 7h are plan views illustrating the fabrication of p-channel and n-channel transistors according to the invention.

Referring now to FIGS. 7a through 7e, a method for construction of both n-channel and p-channel transistors 100n and 100p, respectively, will be described. FIG. 7a illustrates the structure after the formation of semiconductor mesas 5p and 5n. Mesa 5p is p-type doped silicon, and mesa 5n is n-type doped silicon; each of mesas 5n and 5p may receive blanket threshold voltage adjust implants, as conventional in the art. Polysilicon gate electrodes 10n and 10p are disposed over their respective mesas 5n and 5p, overlying a gate dielectric 14 in the conventional manner.

Figure 7B:
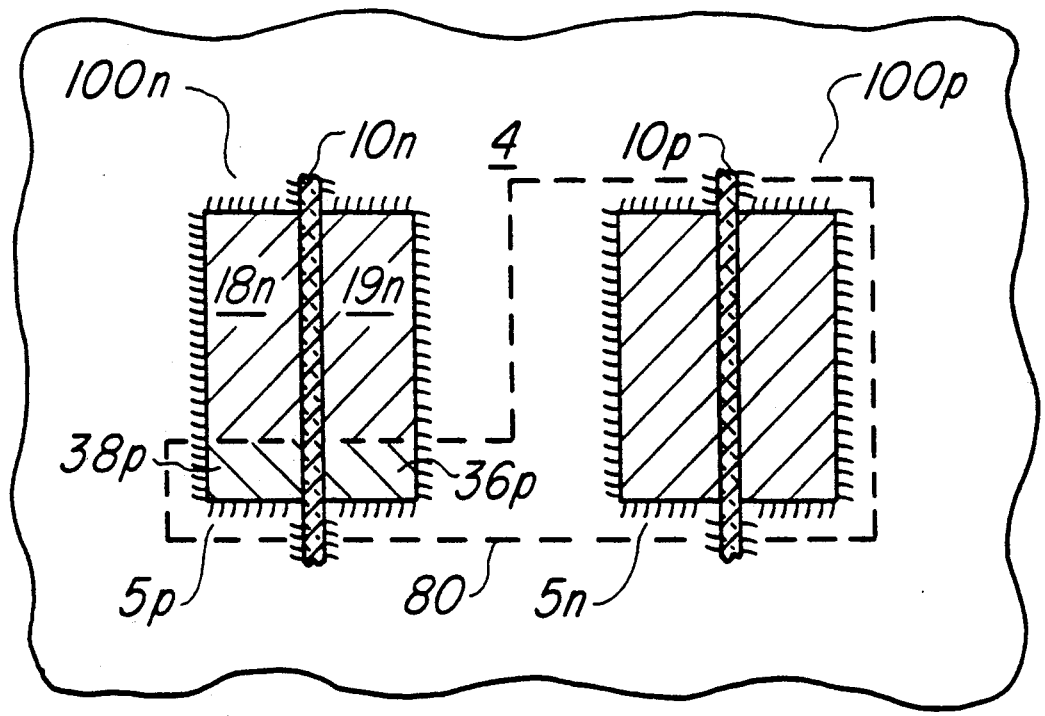
Figure 7C:
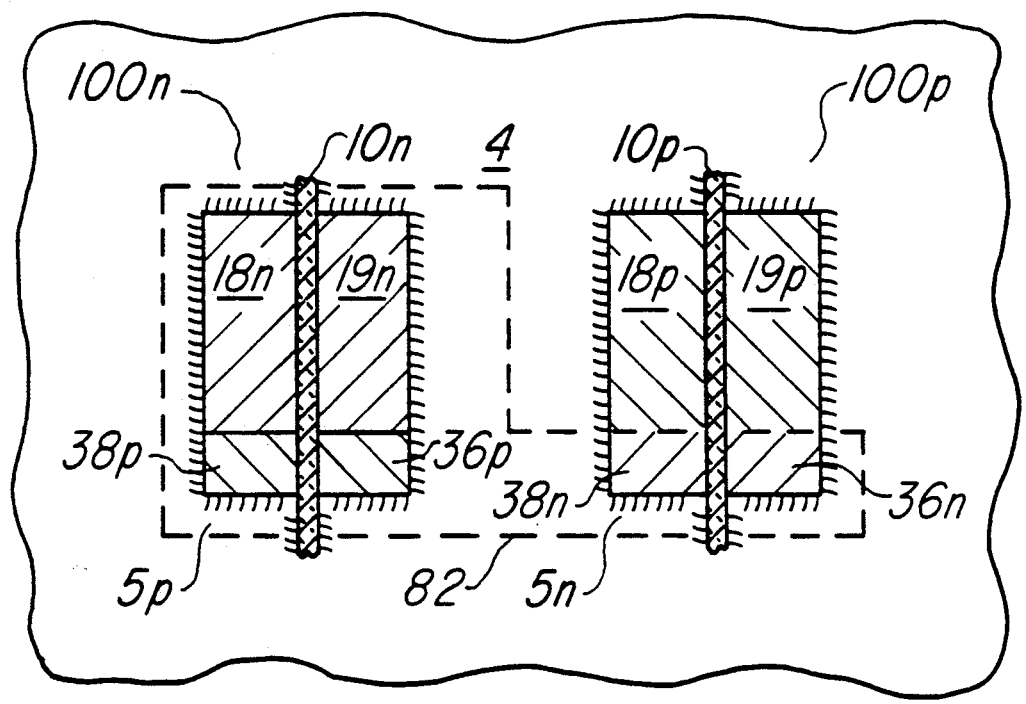

FIG. 7b illustrates the first of the steps in implanting the source and drain regions of transistors 100n and 100p. A mask layer 80, consisting of patterned photoresist or hard mask material such as silicon dioxide, is disposed over the surface of the structure to define the regions to receive the first n-type implant. In this embodiment, the first implant is an n-type implant for formation of lightly-doped drain regions 18n and 19n, and accordingly this implant is of a relatively light dose and energy, to provide a lightly-doped n-type region near the surface of mesa 5p, as described, for example, in the above-referenced U.S. Pat. No. 4,356,623. Mask layer 80 protects the whole of mesa 5n from this implant, and also protects a portion of mesa 5p from this implant, thereby defining contact regions 38p and 36p. The width of contact regions 36p and 38p need not be so wide as to have a contact placed fully therewithin, as will be shown later, but must be sufficiently wide to accommodate the alignment tolerance of the particular photlithography process, plus lateral diffusion of the source/drain dopant, as well as any mesa edge etch bias. Referring to FIG. 7c, a mask layer 82 is similarly provided for the p-type lightly-doped drain implant, for forming regions 18p and 19p in mesa 5n. Mask layer 82 protects regions 18n, 19n, 36p and 38p in mesa 5p from this implant, and protects a portion of mesa 5n from this implant to define contact regions 36n and 38n.

Figure 7D:
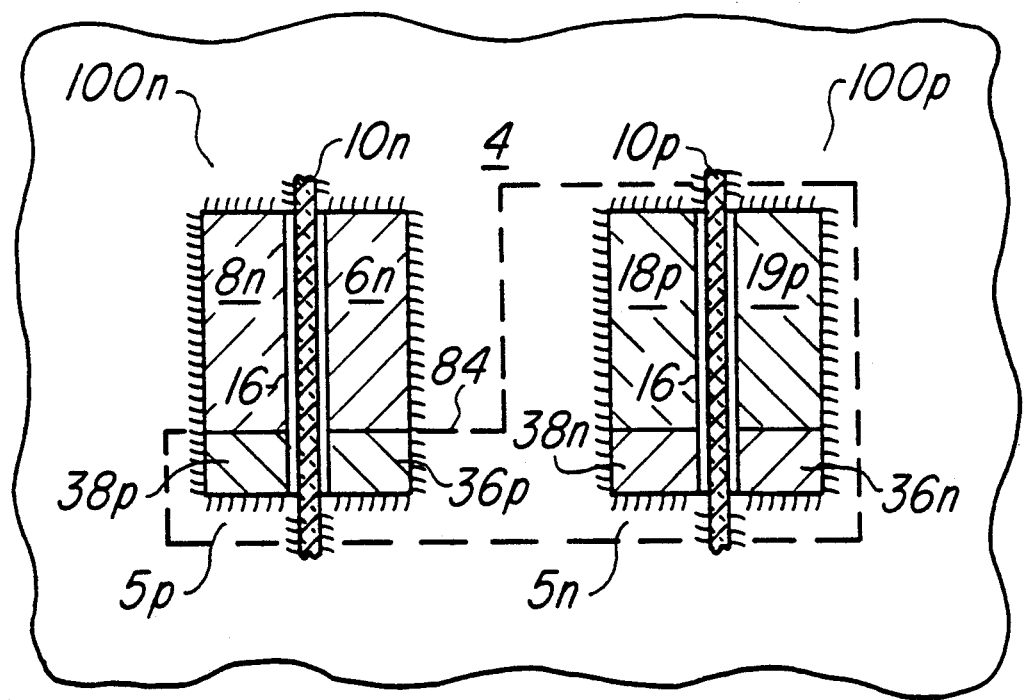
Figure 7E:
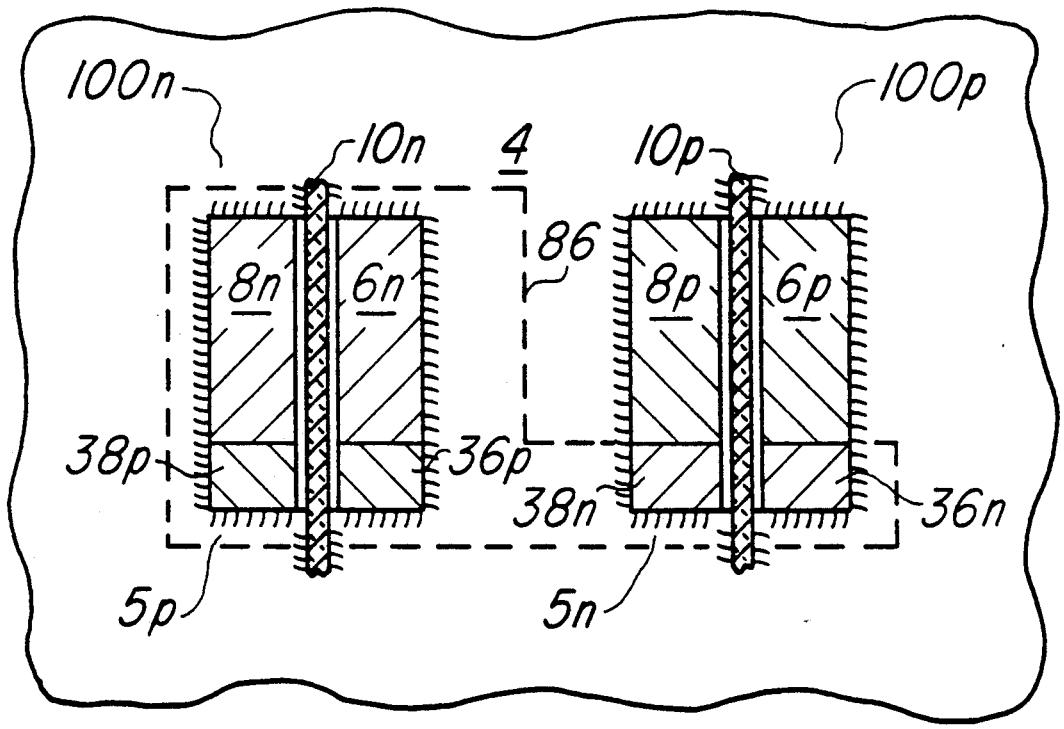

FIG. 7d illustrates mask layer 84, which defines the portion of the structure which is to receive the heavier source/drain implant. It should be noted that sidewall oxide filaments 16 are provided on the sides of gate electrodes 10n and 10p, to protect a portion of regions 18 and 19 from exposure to the source/drain implant, and provide a graded junction as described in said U.S. Pat. No. 4,356,623. Sidewall oxide filaments 16 are, as described above and in said U.S. Pat. No. 4,356,623, formed by the deposition of an oxide layer and a subsequent anisotropic etch. Mask layer 84, similar as mask layer 80, protects the whole of mesa 5n and contact regions 36p and 38p in mesa 5p from the n-type source/drain implant. It should be noted that the mask pattern that forms mask layer 80 may be the same mask pattern used to form mask layer 84, as the same regions are protected and exposed by the two mask layers in this embodiment. Regions 6n and 8n are thus formed from this source/drain implant. FIG. 7e similarly shows mask layer 86 used to define the portions of the structure which are to receive the p-type source/drain implant. Accordingly, mask layer 86, similarly as mask layer 82, protects the whole of mesa 5p from the implant, and protects contact regions 36n and 38n from the p-type source/drain implant. Heavily-doped regions 6p and 8p are thus formed by the source/drain implant, with lightly-doped drain regions 18p and 19p remaining under sidewall filaments 16 on gate electrode 10p to form the graded junction.

It should be noted that the formation of contact regions 36 and 38 by the above exemplary method is accomplished by protecting a portion of the mesa 5 from all implants used in formation of the source and drain regions of the transistors. It should be noted that contact regions 36 and 38 may be exposed to a threshold adjustment implant, if such an implant is used. This provides contact regions 36 and 38 which remain at the surface of the mesas 5, such surface portions remaining ohmically connected to the body region 12 underlying gate electrodes 10.

It should be noted that each of the implants shown in FIGS. 7b through 7e may be driven immediately after each masking step, or may be subjected to a single drive-in anneal after all four of the implants described herein are performed. The point at which the drive-in anneal or anneals are done is not critical to the fabrication of the structures according to the invention. It should further be noted that the order in which the implants are done (i.e., p-type prior to n-type) is arbitrary. The resultant structure may be equivalently formed by performing the p-type implants prior to the n-type, if desired.

Figure 7F:
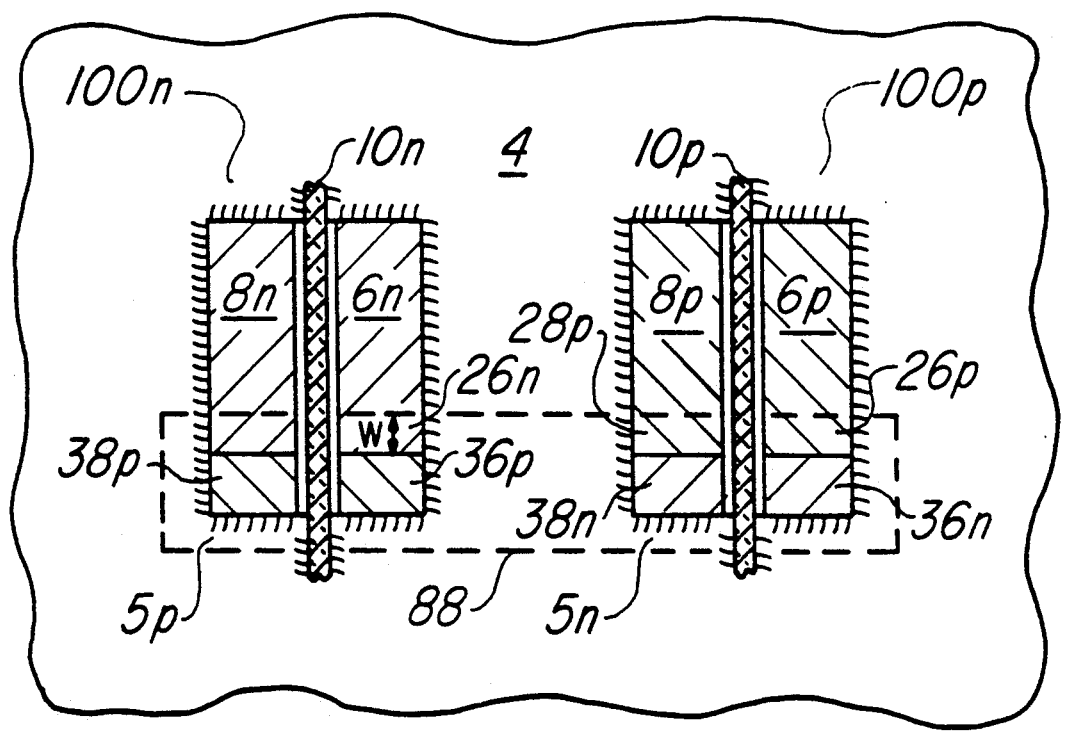

Referring now to FIG. 7f, a mask layer 88 is shown in place for protection of certain portions of the structure from silicidation. Mask layer 88 is preferably a patterned hard mask, such as silicon dioxide or silicon nitride, so that deposition of a refractory metal such as titanium thereover will not form a silicide with the silicon portions underlying mask layer 88. Mask layer 88 covers contact regions 36 and 38 in both mesas 5n and 5p, and also a portion of each of the heavily-doped regions 6 and 8 in both transistors 100n and 100p. The portions of the source and drain regions protected by mask layer 88 are defined as non-silicided n+ regions 26n and 28n in transistor 100n, and non-silicided p+ regions 26p and 28p in transistor 100p.

The reason for providing non-silicided regions 26 and 28 is to ensure that the silicidation does not connect both region 8 to contact region 38 and also region 6 to contact region 36. Such connection, of course, would render the transistor inoperable (i.e., a DC short circuit between source and drain). According to the invention, the body node to source connection is to be selectable by the contact mask level; accordingly, connection at the silicide level is not desired. Of course, it should be noted that mask layer 88 may be used to select which side of each transistor 100 is to be source and which is to be drain, by not covering contact region 36 or 38 in a given transistor 100 so that the selected contact region 36 or 38 is connected through the silicide to the selected source region 6 or 8. Since it is preferable to make such selection as late as possible in the process, where transistors 100 are used in mask-programmable devices such as gate arrays, it is preferable that the contact mask level instead be used for such definition.

Figure 7G:
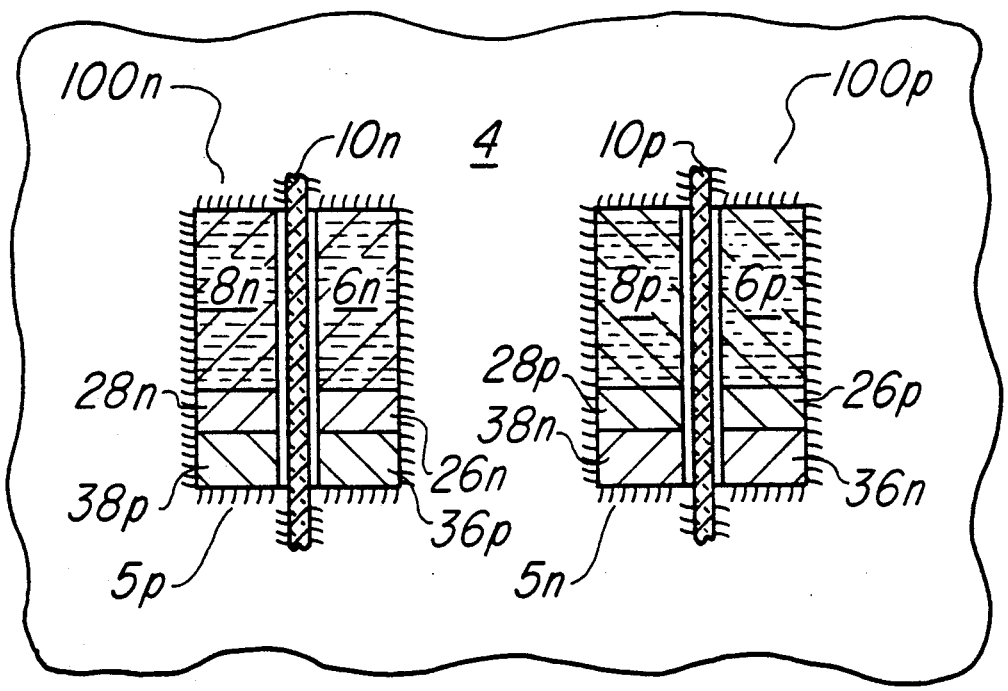

A dimension W is illustrated in FIG. 7f as the width of regions 26 and 28, i.e., the width of the regions 6 and 8 which are not to be silicided. Dimension W preferably is a distance which is at least as large as twice the alignment tolerance of the given photolithography process plus the amount of expected lateral silicidation. Silicidation of the structure illustrated in FIG. 7f is then performed, preferably by the deposition of the refractory metal over the structure and a subsequent annealing to react the metal where in contact with silicon to form the silicide, as described in the above-referenced U.S. Pat. No. 4,545,116. FIG. 7g illustrates the silicidation of regions 6 and 8 and gate electrodes 10 indicated by the dashed lines.

It should be noted that, in the structure shown in FIG. 7g, fabricated through silicidation and after deposition of interlevel dielectric 40 as described above (not shown in FIG. 7g), no selection of which of regions 6 and 8 are to be source or drain has yet necessarily be made, as there is no ohmic connection between either region 6 and 8 and either of its associated contact regions 26 or 28. Accordingly, region 8n may be selected as the source of transistor 100n by connection to its contact region 38p, or region 6n may be selected as the source of transistor 100n by connection to its contact region 36p.

Figure 7H:
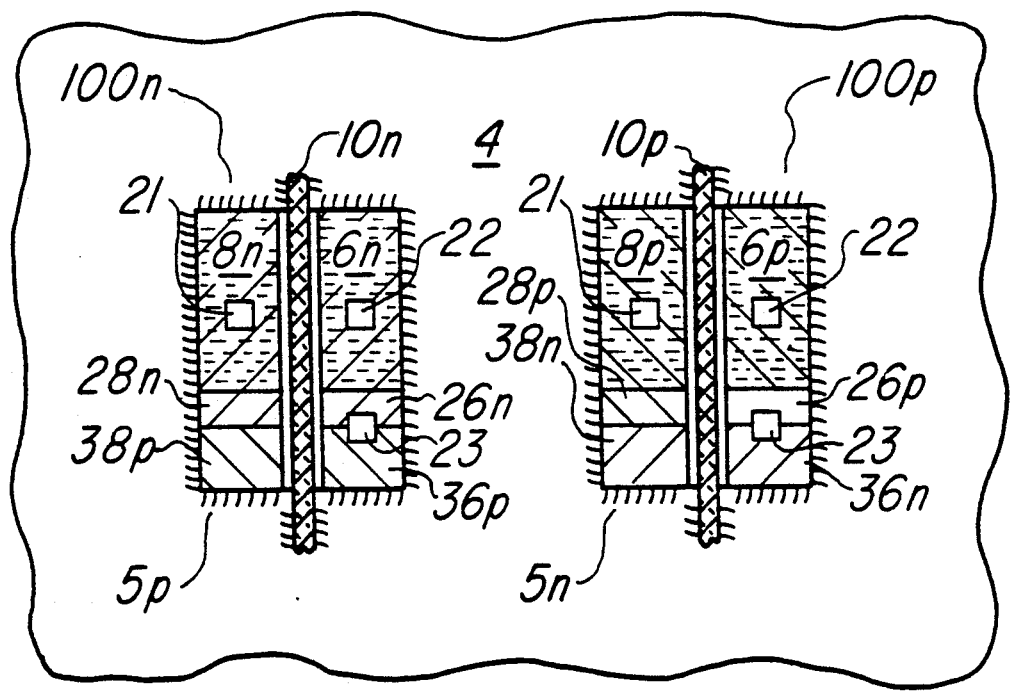

FIG. 7h indicates the positioning of contacts 21 and 22 for connection of a subsequently formed metal line to regions 8 and 6, respectively. FIG. 7h also indicates the formation of contacts 23 to contact regions 36, which selects in this case regions 6 as the source region for each of transistors 100n and 100p. Contacts 23 are shown in FIG. 7h as overlapping the boundary between contact regions 36 and the adjacent non-silicided region 26; such overlap is permissible due to the low current required to flow into contact region 36 for biasing of the body node 12, and is desirable for minimization of the surface area required to provide the contact. Of course, contact 23 may, if space permits, be placed fully within contact region 36, so that a bias voltage may be applied to body node 12 of the transistor 100 independent from that of source region 6. Metallization is then deposited and patterned to connect source regions 6 to contact regions 36 through contacts 22 and 23, as shown in FIG. 3 described hereinabove.

While only single contact regions 36 and 38 on each side of gate electrode 10 are illustrated hereinabove, it should be noted that for reasons of uniform body node bias, especially in relatively wide transistors, multiple contact regions 36 and 38 may be necessary for a given transistor, not only at the edges of mesa 5 but also in the interior of the transistor. Such additional contact regions may be formed in the same manner as described hereinabove relative to transistor 100, by protecting the contact regions from source/drain implants, and by protecting the contact region and a surrounding portion of the source/drain from silicidation.

As mentioned hereinabove, contact regions 36 and 38 are portions of the relatively lightly-doped mesas 5 which are protected from subsequent ion implant steps used to form the source and drain regions 6 and 8. Accordingly, metal lines 25 in FIG. 3 connects directly to a relatively lightly-doped region 36 which, due to the low level of current passing therethrough, is a sufficient contact to bias body node 12. Improved ohmic contact may be made by heavily doping portions of contact regions 36 and 38 at the expense of added process complexity. A first alternative process for providing a more heavily-doped region in contact region 36 to which to make contact would be to expose contact regions 36 and 38 to the source/drain implant used to form the source and drain regions of the opposite conductivity type transistor. For example, for source/drain implant of regions 6p and 8p in transistor 100p in FIG. 7e, mask layer 86 could expose contact regions 36p and 38p in transistor 100n to the source/drain implant; n-type contact regions 36n and 38n would receive the n-type source/drain implant. Silicidation would be masked from the contact regions 36 and 38, and regions 26 and 28, as before. It should be noted, however, that this method would result in n+ and p+ regions abutting one another, providing a finite amount of Zener diode leakage between drain region 8 and 28 and the body node 12 of the transistor. This construction is thus available in the event the resulting leakage current is tolerable, however additional mesa area would likely be required in order to obey spacing and alignment tolerance rules. A second alternative method for forming a more heavily-doped contact region 36 is to add another mask step which would more hevaily dope a portion of contact regions 36 and 38, keeping a lightly-doped portion of contact regions 36 and 38 between the heavily doped portion and the neighboring regions 26 and 28. This method would avoid the Zener diode leakage of the first alternative method, but would also require additional mesa area to satisfy spacing and alignment requirements.

It should be noted that while the above description is with reference to an example using graded source/drain junctions (i.e, using the lightly-doped drain extensions), it should be noted that the invention is equivalently applicable to transistors having abrupt junctions, formed in the conventional manner self-aligned to the gate electrode.

Figure 8:
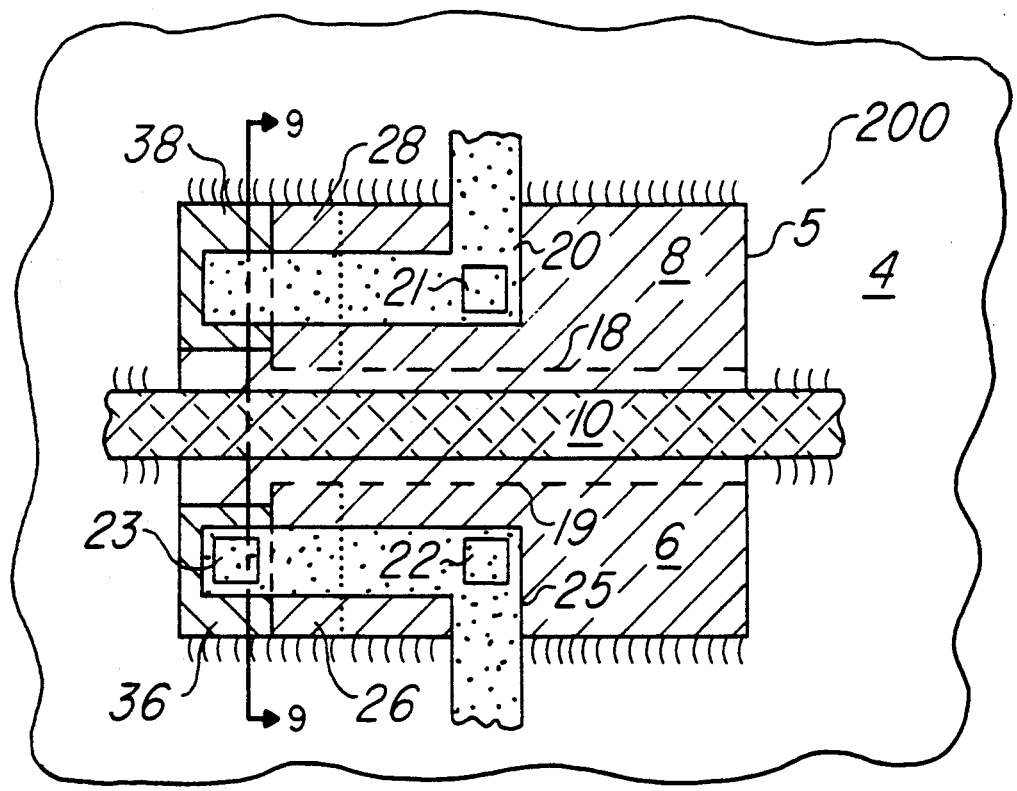
FIG. 8 is a plan view of an SOI MOS transistor constructed according to a second embodiment of the invention.
Figure 9:
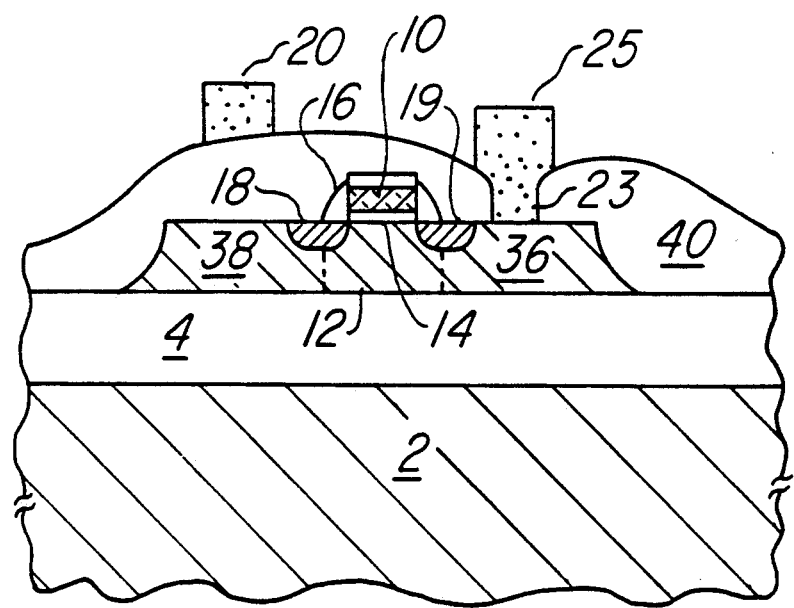
FIG. 9 is a cross-sectional view of the transistor of FIG. 8.

FIGS. 8 and 9 illustrate a second embodiment of a transistor 200 constructed according to the invention is illustrated. Transistor 100 of the first described embodiment, since it has contact regions 36 and 38 adjacent to gate electrode 10, sacrifices a portion of the transistor channel width in order to provide the contact to body node 12. Referring to FIG. 8, lightly doped drain extensions 18 and 19 are disposed at the surface of mesa 5 between contact regions 38 and 36, respectively, and gate electrode 10; sidewall oxide filaments 16 overly lightly-doped drain extensions 18 and 19 adjacent gate electrode 10 but are not shown in FIG. 8 for the sake of clarity. FIG. 9 is a cross-sectional view of transistor 200 taken in the same location and direction as FIG. 6 described hereinabove, and shows the provision of lightly-doped drain extensions 18 and 19 between contact regions 36 and 38 at the surface of the structure; contact regions 36 and 38 remain in ohmic contact with body node 12 since extensions 18 and 19 are relatively shallow.

Transistors 200 can be constructed in a similar manner as transistor 100 described hereinabove, except that the patterns for the lightly-doped drain implant will differ from those for the heavy source/drain implant. The mask layer for the lightly-doped drain implant will expose a portion of the surface between contact regions 36 and 38 and gate electrode 10, but the mask layer for the source/drain implant will protect these regions from the heavier implant.

Transistor 200 therefore, due to the provision of lightly-doped drain regions 18 and 19 between contact regions 36 and 38 and the body node 12 at the surface of transistor 200, provides for body-to-source connection without a reduction in the channel width of the transistor. A slight increase in the series "on" resistance of transistor 200 necessarily results from this construction, as the current flow through the portions of the lightly-doped drain regions 18 and 19 adjacent contact regions 36 and 38 will be required to travel a longer path therethrough. It should be noted, however, that this increase in series resistance will be minimal, as the increased resistance is in parallel with the low resistance current path in the locations at which lightly-doped drain region 18 and 19 are adjacent source regions 6 and 26, and drain regions 8 and 28, respectively. It should further be noted that the increases series resistance is also minimized due to the increased width of the portions of lightly-doped drain regions 18 and 19 adjacent contact regions 36 and 38 relative to their width adjacent source 6 and drain 8 defined by sidewall insulator filaments 16. Therefore, transistor 200 of the second embodiment of the invention provides body-to-source connection without a reduction in the channel width, with minimal impact on the source/drain resistance of the transistor when conducting.

Figure 10:
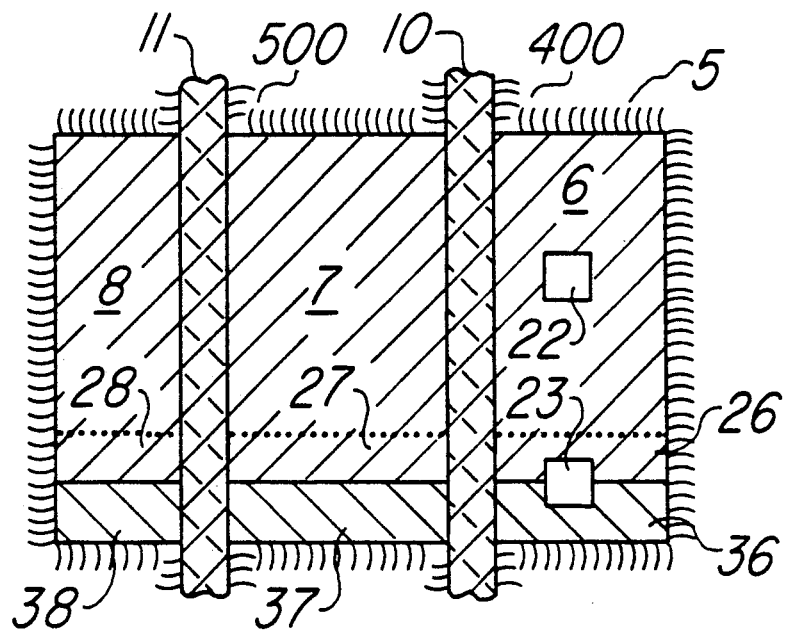
FIG. 10 is a plan view of a mesa containing a pair of transistors constructed according to the invention.
Figure 11:
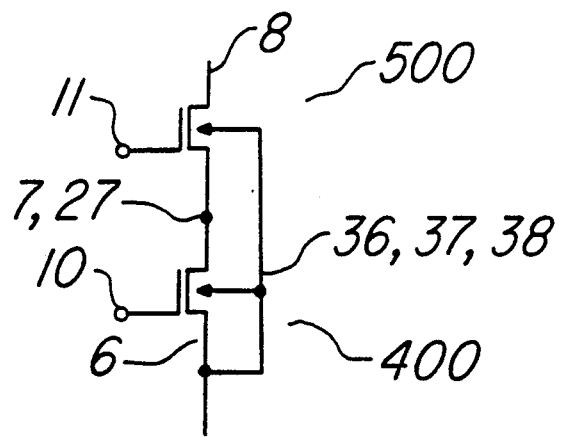
FIG. 11 is an electrical diagram, in schematic form, of the pair of transistors in FIG. 10.

Referring now to FIGS. 10 and 11, a mesa 5 having a pair of transistors 400 and 500 is illustrated in plan view and schematically. As described above, it is noted that the instant invention provides for selectable body-to-source connection, such selectable connection being especially useful in logic array applications.

Mesa 5 of FIG. 10 contains a pair of n-channel MOS transistors 400 and 500. Transistor 500, having gate electrode 11, has silicided n+ regions 7 and 8 (silicide film is not shown in FIG. 10 for the sake of clarity) available to provide source and drain, while transistor 400, having gate electrode 10, has silicided n+ regions 7 and 6 available for source and drain. Associated with each of n+ regions 6, 7, and 18 are non-silicided n+ regions 26, 27, and 28 and p-type contact regions 36, 37, and 38, respectively. Transistors 400 and 500 of FIG. 10 are shown constructed with abrupt source/drain junctions (i.e., no lightly-doped drain regions 18 and 19), although construction with graded junctions, as described in the embodiments of FIGS. 3 through 9, is equally applicable to transistors 400 and 500 of FIG. 10.

As in the embodiments described hereinabove, any of the contact regions 36, 37, and 38 in the structure of FIG. 10 may be selected at the contact mask level to provide body-to-source connection depending upon the desired transistor configuration. The construction of FIG. 10 having multiple transistors on a common mesa provides for increased flexibility in such selection, as well as providing for body region bias for all transistors in the mesa 5 with a single contact. It should be noted that contact regions 36, 37 and 38 are all connected to one another under gates 10 and 11 in a similar manner as shown in FIG. 6 for a single transistor. Accordingly, bias of one of the contact regions will bias the body nodes 12 of both transistors 400 and 500 of mesa 5. This allows body node bias for a transistor which could not otherwise be provided such bias, as will be explained below.

In the example of FIG. 6, contacts 22 and 23 are shown to illustrate (the interconnecting metal line not shown for simplicity) connection of n+region 6 to contact region 36. Accordingly, region 6 serves as the source of transistor 400, and region 7 serves as the drain thereof. In this example, therefore, transistors 400 and 5o0 are connected in series, with the transistor 500 having region 7 as its source and region 8 as its drain. With contact region 36 tied to source region 6, and with connection between regions 36 and 37 under gate electrode 10 as explained above, both transistors 400 and 500 have their body nodes biased to the potential of the source region 6. An equivalent circuit schematic is provided in FIG. 11; such a configuration can appear in a logic gate such as a NAND, as is known in the art. Transistor 500, in this example, has its body node biased to a potential which may not be the potential of its source 7, but which is the lowest potential of the transistor pair; such bias is as provided in bulk configurations, where the body nodes of the MOS transistors are biased by the substrate. It should be noted that the body node of transistor 500 could not be biased to the potential of its source, as transistor 400 would be rendered inoperable thereby; accordingly, in prior SOI structures, transistor 500 would have a floating body node (and the problems associated therewith as described hereinabove), or would have its body node biased at its source potential, which may not be the lowest potential in the circuit. Incorporation of the invention into a multiple transistor structure as shown in FIG. 10 thus provides for uniform bias of the body nodes of all transistors in a common mesa, and improved performance of the circuit thereby.

It should be noted that different transistor configurations from the one shown in FIG. 11 could be selected for the structure of FIG. 10. For example, with contact region 36 connected to n+region 6, transistor 500 could serve as a pass transistor, such as the pass transistor between the bit line and the storage node in a static memory cell constructed with cross-coupled inverters, with transistor 400 serving as the pull-down transistor for one of the inverters. Pass transistor 500 thus would have its body node biased to the potential of the source of pull-down transistor 400. It should be noted that both pull-down transistors and both pass transistors for such a memory cell could be fabricated in a single mesa such as shown in FIG. 10, with only one contact required to provide body node bias for all four transistors. A second example of a different configuration for the structure of FIG. 10 would be achieved by connecting transistors 400 and 500 in parallel, with body node bias provided by a single contact with contact region 37 connected to n+region 7; region 7 could thus serve as the source for both transistors 400 and 500, with the drains separate. In addition, for purposes of routing it may be convenient for transistor 400 to be the upper transistor rather than transistor 500 as in FIG. 11; in this event, contact region 38 would be tied to n+ region 8 in transistor 500, biasing the body nodes of both transistors 400 and 500 to the potential of n+ region 8.

Provision of contact regions 36, 37, and 38 thus increases flexibility for the configuration of multiple transistors on a common mesa. It is contemplated that more than two transistors could be similarly formed on a single mesa 5, with a single body-to-source connection providing bias for all such transistors in similar manner. Furthermore, as described hereinabove, contact regions 36, 37, and 38 can be made sufficiently wide so that a contact such as contact 23 can be placed fully within a contact region, without overlapping into non-silicided regions 26, 27, and 28. Such placement of the contact allows a voltage other than that of the source of one of the transistors to bias the body nodes, further increasing the potential transistor configurations available from this structure. While the structure of FIG. 10, as well as the other embodiments of the invention, have been described with reference to n-channel transistors, the invention is of course equally applicable to p-channel transistors, as well as to both p-channel and n-channel transistors within a single integrated circuit in CMOS configurations. With reference to the structure of FIG. 10, it should be noted that both p-channel and n-channel transistors could be formed in the same mesa, with a single contact providing body contact for the transistors of each channel conductivity type, so long as the common p-type body node for the n-channel transistors is kept isolated from the common n-type body node for the p-channel transistors.

Furthermore, although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to and made by persons of ordinary skill in the art having reference to this description. It is contemplated that such changes and additional embodiments are within the spirit and true scope of the invention as claimed.

I claim:

1. A transistor formed in a semiconductor layer overlying an insulating film, comprising:
    a gate electrode overlying a body node portion of said semiconductor layer, said body node portion being of a first conductivity type and having first and second sides;
    a drain region of said semiconductor layer, said drain region being of said second conductivity type and disposed adjacent a first side of said body node portion;
    a source region of said semiconductor layer, said source region being of said second conductivity type, and disposed adjacent a second side of said body node portion;
    a first contact region of said semiconductor layer, said first contact region being of said first conductivity type, disposed adjacent said source region and adjacent said second side of said body node portion;
    a second contact region of said semiconductor layer, said second contact region being of said first conductivity type, disposed adjacent said drain region and adjacent said first side of said body node portion; and
    an ohmic connection between said first contact region and said source region.

2. The transistor of claim 1, further comprising:
    an interlevel dielectric overlying said source region; and wherein said ohmic connection comprises a metal line connected to said first contact region and to said source region through contact vias in said interlevel dielectric.

3. The transistor of claim 1, wherein said drain, source and first contact regions extend through the full thickness of the semiconductor layer.

4. The transistor of claim 1, further comprising a gate dielectric layer disposed between said gate electrode and said body node portion.

5. The transistor of claim 1, further comprising:
    sidewall dielectric filaments disposed along the sides of said gate electrode.

6. The transistor of claim 5, wherein said source region comprises:
    a first portion adjacent said body node portion; and
    a second portion adjacent said first portion and adjacent said first contact region, said second portion relatively heavily doped relative to said first portion.

7. The transistor of claim 6, wherein said first portion is disposed between said first contact region and said second side of said body node portion at the surface of said semiconductor layer, said first contact region being deeper than said first portion of said source region so that said first contact region is in contact with said body node portion at a location below said first portion of said source region.

8. The transistor of claim 1, wherein said source region comprises:
    a clad portion having a refractory metal silicide film disposed thereover; and
    an unclad portion, disposed between said clad portion and said first contact region, said unclad portion not having a refractory metal silicide film disposed thereover;
    and wherein said drain region comprises:
    a clad portion having a refractory metal silicide film disposed thereover; and
    an unclad portion, disposed between said clad portion and said second contact region, said unclad portion not having a refractory metal silicide film disposed thereover.

9. The transistor of claim 8, further comprising:
    an interlevel dielectric overlying said source region and said first contact region;
    wherein said ohmic connection comprises a metal line connected to said first contact region and to said source region through contact vias in said interlevel dielectric;

and wherein the contact via in said interlevel dielectric in contact with said first contact region overlaps into said unclad portion of said source region.

10. The transistor of claim 8, further comprising:
an interlevel dielectric overlying said source region and said first contact region;
wherein said ohmic connection comprises a metal line connected to said first contact region and to said source region through contact vias in said interlevel dielectric;
and wherein the contact via in said interlevel dielectric in contact with said first contact region is fully disposed within said first contact region.

11. The transistor of claim 1, wherein said semiconductor layer is a mesa overlying said insulator layer.

12. The transistor of claim 11, wherein said first contact region is disposed adjacent a first edge of said mesa.

13. A transistor formed in a semiconductor layer overlying an insulating film, comprising:
a gate electrode overlying a body node portion of said semiconductor layer, said body node portion being of a first conductivity type and having first and second sides;
a drain region of said semiconductor layer, said drain region being of said second conductivity type and disposed adjacent a first side of said body node portion, said drain region comprising:
a clad portion having a refractory metal silicide film disposed thereover; and
an unclad portion, disposed between said clad portion and said second contact region, said unclad portion not having a refractory metal silicide film disposed thereover;
a source region of said semiconductor layer, said source region being of said second conductivity type, and disposed adjacent a second side of said body node portion, said source region comprising:
a clad portion having a refractory metal silicide film disposed thereover; and
an unclad portion, disposed between said clad portion and said first contact region, said unclad portion not having a refractory metal silicide film disposed thereover;
a first contact region of said semiconductor layer, said first contact region being of said first conductivity type, disposed adjacent said second side of said body node portion, said unclad portion of said source region being disposed between said first contact region and said clad portion of said source region; and
a second contact region of said semiconductor layer, said second contact region being of said first conductivity type, disposed adjacent said first side of said body node portion, said unclad portion of said drain region being disposed between said second contact region and said clad portion of said drain region.

14. The transistor of claim 13, further comprising ohmic connection between said first contact region and said source region.

15. The transistor of claim 13, further comprising:
an interlevel dielectric overlying said source region and said first contact region; and
a metal line in contact with said first contact region through a contact via in said interlevel dielectric.

16. The transistor of claim 15, wherein said metal line is also connected to said source region through a contact via in said interlevel dielectric;
and wherein the contact via in said interlevel dielectric in contact with said first contact region overlaps into said unclad portion of said source region.

17. The transistor of claim 15, wherein said metal line is also connected to said source region through a contact via in said interlevel dielectric;
and wherein the contact via in said interlevel dielectric in contact with said first contact region is fully disposed within said first contact region.

18. The transistor of claim 13, wherein each of said clad and unclad portions of said source region comprise:
a first portion adjacent said second side of said body node portion; and
a second portion adjacent said first portion and adjacent said first contact region, said second portion relatively heavily doped relative to said first portion.

19. The transistor of claim 18, wherein said first portion of said unclad portion of said source region is disposed between said first contact region and said second side of said body node portion at the surface of said semiconductor layer, said first contact region being deeper than said first unclad portion of said source region so that said fist contact region is in contact with said body node portion at a location below said first unclad portion of said source region.

20. An integrated circuit formed in a semiconductor layer overlying an insulating film, comprising:
first, second and third doped regions of a first conductivity type in said semiconductor layer, said first and second doped regions separated from one another by a first body region of a second conductivity type, and said second and third doped regions separated from one another by a second body region of said second conductivity type;
first and second gate electrodes overlying said first and second body regions, respectively;
first, second and third contact regions formed in said semiconductor layer adjacent said first, second and third doped regions, respectively, said first and second contact regions in ohmic contact with said first body region and said second and third contact regions in ohmic contact with said second body region; and
ohmic connection between one of said first, second and third contact regions and its adjacent first, second or third doped region.

21. The transistor of claim 20, further comprising:
an interlevel dielectric overlying said first, second and third doped regions and said first, second and third contact regions;
and wherein said ohmic connection comprises a metal line connected to said selected contact region and to its adjacent doped region through contact vias in said interlevel dielectric.

22. The transistor of claim 20, wherein said doped regions and said contact regions extend through the full thickness of the semiconductor layer.

23. The transistor of claim 20, further comprising a gate dielectric layer disposed between said gate electrodes and said body regions.

24. The transistor of claim 20, further comprising:
sidewall dielectric filaments disposed along the sides of said gate electrodes.

25. The transistor of claim 24, wherein said doped regions each comprise:
   a first portion adjacent its adjacent body region; and
   a second portion adjacent said first portion and adjacent its adjacent contact region, said second portion relatively heavily doped relative to said first portion.

26. The transistor of claim 20, wherein each doped region comprises:
   a clad portion having a refractory metal silicide film disposed thereover; and
   an unclad portion, disposed between said clad portion and its adjacent contact region, said unclad portion not having a refractory metal silicide film disposed thereover.

27. The transistor of claim 20, wherein said semiconductor layer is a mesa overlying said insulator layer.

28. The transistor of claim 27, wherein said first contact region is disposed adjacent a first edge of said mesa.

* * * * *